US012249262B2

(12) United States Patent
Amundson et al.

(10) Patent No.: US 12,249,262 B2
(45) Date of Patent: Mar. 11, 2025

(54) METHODS FOR MEASURING ELECTRICAL PROPERTIES OF ELECTRO-OPTIC DISPLAYS

(71) Applicant: E INK CORPORATION, Billerica, MA (US)

(72) Inventors: Karl Raymond Amundson, Cambridge, MA (US); Teck Ping Sim, Acton, MA (US); Michael D. McCreary, Acton, MA (US); Yi Lu, Needham, MA (US)

(73) Assignee: E Ink Corporation, Billerica, MA (US)

( * ) Notice: Subject to any disclaimer, the term of this patent is extended or adjusted under 35 U.S.C. 154(b) by 11 days.

(21) Appl. No.: 18/345,523

(22) Filed: Jun. 30, 2023

(65) Prior Publication Data

US 2023/0343260 A1    Oct. 26, 2023

Related U.S. Application Data

(63) Continuation of application No. 18/146,608, filed on Dec. 27, 2022, now Pat. No. 11,854,448.

(Continued)

(51) Int. Cl.
*G09G 3/00* (2006.01)
*G01R 27/16* (2006.01)
(Continued)

(52) U.S. Cl.
CPC ............ *G09G 3/006* (2013.01); *G01R 27/16* (2013.01); *G09G 3/2007* (2013.01); *G09G 3/344* (2013.01);
(Continued)

(58) Field of Classification Search
CPC ...... G09G 3/006; G09G 3/2007; G09G 3/344; G09G 2310/06; G09G 2320/0257;
(Continued)

(56) References Cited

U.S. PATENT DOCUMENTS 4,418,346 A    11/1983    Batchelder
5,760,761 A    6/1998    Sheridon
(Continued)

OTHER PUBLICATIONS

Wood, D., "An Electrochromic Renaissance?" Information Display, 18(3), 24 (Mar. 2002).
(Continued)

*Primary Examiner* — Adam R. Giesy
(74) *Attorney, Agent, or Firm* — Jason P. Colangelo

(57) ABSTRACT

A method for driving electro-optic displays including electro-optic material disposed between a common electrode and a backplane. The backplane includes an array of pixel electrodes, each coupled to a transistor. A display controller applies waveforms to the pixel electrodes. The method includes applying first measurement waveforms to a first portion of the pixel electrodes. During each frame of the first measurement waveforms, the same time-dependent voltages are applied to each pixel electrode of the first portion of pixel electrodes. The method includes determining the impedance of the electro-optic material in proximity to the first portion of pixel electrodes based on a measurement of the current flowing through a current measurement circuit and the time-dependent voltages applied to each pixel electrode during the first measurement waveforms, and selecting driving waveforms based on the impedance of the electro-optic material in proximity to the first portion of pixel electrodes.

14 Claims, 11 Drawing Sheets

Related U.S. Application Data

(60) Provisional application No. 63/301,747, filed on Jan. 21, 2022, provisional application No. 63/293,947, filed on Dec. 27, 2021.

(51) Int. Cl.
*G09G 3/20* (2006.01)
*G09G 3/34* (2006.01)

(52) U.S. Cl.
CPC . *G09G 2310/06* (2013.01); *G09G 2320/0257* (2013.01)

(58) Field of Classification Search
CPC ............. G09G 3/3655; G09G 2300/08; G09G 2310/0205; G09G 2310/0245; G09G 2310/063; G09G 2320/0271; G09G 2320/045; G09G 2320/0693; G09G 2320/08; G09G 2300/0842; G01R 27/16
See application file for complete search history.

(56) References Cited

U.S. PATENT DOCUMENTS

| | | |
|---|---|---|
| 5,777,782 A | 7/1998 | Sheridon |
| 5,808,783 A | 9/1998 | Crowley |
| 5,872,552 A | 2/1999 | Gordon, II et al. |
| 5,930,026 A | 7/1999 | Jacobson et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,128,124 A | 10/2000 | Silverman |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,172,798 B1 | 1/2001 | Albert et al. |
| 6,184,856 B1 | 2/2001 | Gordon, II et al. |
| 6,225,971 B1 | 5/2001 | Gordon, II et al. |
| 6,241,921 B1 | 6/2001 | Jacobson et al. |
| 6,271,823 B1 | 8/2001 | Gordon, II et al. |
| 6,301,038 B1 | 10/2001 | Fitzmaurice et al. |
| 6,445,489 B1 | 9/2002 | Jacobson et al. |
| 6,504,524 B1 | 1/2003 | Gates et al. |
| 6,512,354 B2 | 1/2003 | Jacobson et al. |
| 6,531,997 B1 | 3/2003 | Gates et al. |
| 6,753,999 B2 | 6/2004 | Zehner et al. |
| 6,788,449 B2 | 9/2004 | Liang et al. |
| 6,825,970 B2 | 11/2004 | Goenaga et al. |
| 6,866,760 B2 | 3/2005 | Paolini, Jr. et al. |
| 6,870,657 B1 | 3/2005 | Fitzmaurice et al. |
| 6,900,851 B2 | 5/2005 | Morrison et al. |
| 6,922,276 B2 | 7/2005 | Zhang et al. |
| 6,950,220 B2 | 9/2005 | Abramson et al. |
| 6,982,178 B2 | 1/2006 | LeCain et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,023,420 B2 | 4/2006 | Comiskey et al. |
| 7,034,783 B2 | 4/2006 | Gates et al. |
| 7,061,166 B2 | 6/2006 | Kuniyasu |
| 7,061,662 B2 | 6/2006 | Chung et al. |
| 7,072,095 B2 | 7/2006 | Liang et al. |
| 7,075,502 B1 | 7/2006 | Drzaic et al. |
| 7,116,318 B2 | 10/2006 | Amundson et al. |
| 7,116,466 B2 | 10/2006 | Whitesides et al. |
| 7,119,772 B2 | 10/2006 | Amundson et al. |
| 7,144,942 B2 | 12/2006 | Zang et al. |
| 7,170,670 B2 | 1/2007 | Webber |
| 7,177,066 B2 | 2/2007 | Chung et al. |
| 7,193,625 B2 | 3/2007 | Danner et al. |
| 7,202,847 B2 | 4/2007 | Gates |
| 7,236,291 B2 | 6/2007 | Kaga et al. |
| 7,242,514 B2 | 7/2007 | Chung et al. |
| 7,259,744 B2 | 8/2007 | Arango et al. |
| 7,304,787 B2 | 12/2007 | Whitesides et al. |
| 7,312,784 B2 | 12/2007 | Baucom et al. |
| 7,312,794 B2 | 12/2007 | Zehner et al. |
| 7,321,459 B2 | 1/2008 | Masuda et al. |
| 7,327,511 B2 | 2/2008 | Whitesides et al. |
| 7,408,699 B2 | 8/2008 | Wang et al. |
| 7,411,719 B2 | 8/2008 | Paolini, Jr. et al. |
| 7,420,549 B2 | 9/2008 | Jacobson et al. |
| 7,453,445 B2 | 11/2008 | Amundson |
| 7,492,339 B2 | 2/2009 | Amundson |
| 7,528,822 B2 | 5/2009 | Amundson et al. |
| 7,535,624 B2 | 5/2009 | Amundson et al. |
| 7,545,358 B2 | 6/2009 | Gates et al. |
| 7,583,251 B2 | 9/2009 | Arango et al. |
| 7,602,374 B2 | 10/2009 | Zehner et al. |
| 7,612,760 B2 | 11/2009 | Kawai |
| 7,679,599 B2 | 3/2010 | Kawai |
| 7,679,813 B2 | 3/2010 | Liang et al. |
| 7,679,814 B2 | 3/2010 | Paolini, Jr. et al. |
| 7,683,606 B2 | 3/2010 | Kang et al. |
| 7,688,297 B2 | 3/2010 | Zehner et al. |
| 7,715,088 B2 | 5/2010 | Liang et al. |
| 7,729,039 B2 | 6/2010 | LeCain et al. |
| 7,733,311 B2 | 6/2010 | Amundson et al. |
| 7,733,335 B2 | 6/2010 | Zehner et al. |
| 7,787,169 B2 | 8/2010 | Abramson et al. |
| 7,839,564 B2 | 11/2010 | Whitesides et al. |
| 7,859,742 B1 | 12/2010 | Chiu et al. |
| 7,952,557 B2 | 5/2011 | Amundson |
| 7,956,841 B2 | 6/2011 | Albert et al. |
| 7,982,479 B2 | 7/2011 | Wang et al. |
| 7,999,787 B2 | 8/2011 | Amundson et al. |
| 8,009,348 B2 | 8/2011 | Zehner et al. |
| 8,077,141 B2 | 12/2011 | Duthaler et al. |
| 8,125,501 B2 | 2/2012 | Amundson et al. |
| 8,139,050 B2 | 3/2012 | Jacobson et al. |
| 8,174,490 B2 | 5/2012 | Whitesides et al. |
| 8,243,013 B1 | 8/2012 | Sprague et al. |
| 8,274,472 B1 | 9/2012 | Wang et al. |
| 8,289,250 B2 | 10/2012 | Zehner et al. |
| 8,300,006 B2 | 10/2012 | Zhou et al. |
| 8,305,341 B2 | 11/2012 | Arango et al. |
| 8,314,784 B2 | 11/2012 | Ohkami et al. |
| 8,373,649 B2 | 2/2013 | Low et al. |
| 8,384,658 B2 | 2/2013 | Albert et al. |
| 8,456,414 B2 | 6/2013 | Lin et al. |
| 8,462,102 B2 | 6/2013 | Wong et al. |
| 8,514,168 B2 | 8/2013 | Chung et al. |
| 8,537,105 B2 | 9/2013 | Chiu et al. |
| 8,558,783 B2 | 10/2013 | Wilcox et al. |
| 8,558,785 B2 | 10/2013 | Zehner et al. |
| 8,558,786 B2 | 10/2013 | Lin |
| 8,558,825 B2 | 10/2013 | Bae et al. |
| 8,558,855 B2 | 10/2013 | Sprague et al. |
| 8,576,164 B2 | 11/2013 | Sprague et al. |
| 8,576,259 B2 | 11/2013 | Lin et al. |
| 8,593,396 B2 | 11/2013 | Amundson et al. |
| 8,605,032 B2 | 12/2013 | Liu et al. |
| 8,643,595 B2 | 2/2014 | Chung et al. |
| 8,653,832 B2 | 2/2014 | Hadwen et al. |
| 8,665,206 B2 | 3/2014 | Lin et al. |
| 8,668,384 B2 | 3/2014 | Howe et al. |
| 8,681,191 B2 | 3/2014 | Yang et al. |
| 8,730,153 B2 | 5/2014 | Sprague et al. |
| 8,810,525 B2 | 8/2014 | Sprague |
| 8,928,562 B2 | 1/2015 | Gates et al. |
| 8,928,641 B2 | 1/2015 | Chiu et al. |
| 8,976,444 B2 | 3/2015 | Zhang et al. |
| 9,013,394 B2 | 4/2015 | Lin |
| 9,019,197 B2 | 4/2015 | Lin |
| 9,019,198 B2 | 4/2015 | Lin et al. |
| 9,019,318 B2 | 4/2015 | Sprague et al. |
| 9,082,352 B2 | 7/2015 | Cheng et al. |
| 9,171,508 B2 | 10/2015 | Sprague et al. |
| 9,218,773 B2 | 12/2015 | Sun et al. |
| 9,224,338 B2 | 12/2015 | Chan et al. |
| 9,224,342 B2 | 12/2015 | Sprague et al. |
| 9,224,344 B2 | 12/2015 | Chung et al. |
| 9,230,492 B2 | 1/2016 | Harrington et al. |

(56) References Cited

U.S. PATENT DOCUMENTS

| | | | |
|---|---|---|---|
| 9,251,736 B2 | 2/2016 | Lin et al. |
| 9,262,973 B2 | 2/2016 | Wu et al. |
| 9,269,311 B2 | 2/2016 | Amundson |
| 9,279,906 B2 | 3/2016 | Kang |
| 9,299,294 B2 | 3/2016 | Lin et al. |
| 9,373,289 B2 | 6/2016 | Sprague et al. |
| 9,390,066 B2 | 7/2016 | Smith et al. |
| 9,390,661 B2 | 7/2016 | Chiu et al. |
| 9,412,314 B2 | 8/2016 | Amundson et al. |
| 9,460,666 B2 | 10/2016 | Sprague et al. |
| 9,495,918 B2 | 11/2016 | Harrington et al. |
| 9,501,981 B2 | 11/2016 | Lin et al. |
| 9,513,743 B2 | 12/2016 | Sjodin et al. |
| 9,514,667 B2 | 12/2016 | Lin |
| 9,542,895 B2 | 1/2017 | Gates et al. |
| 9,564,088 B2 | 2/2017 | Wilcox et al. |
| 9,612,502 B2 | 4/2017 | Danner et al. |
| 9,620,048 B2 | 4/2017 | Sim et al. |
| 9,620,067 B2 | 4/2017 | Harrington et al. |
| 9,672,766 B2 | 6/2017 | Sjodin |
| 9,691,333 B2 | 6/2017 | Cheng et al. |
| 9,721,495 B2 | 8/2017 | Harrington et al. |
| 9,792,861 B2 | 10/2017 | Chang et al. |
| 9,792,862 B2 | 10/2017 | Hung et al. |
| 9,966,018 B2 | 5/2018 | Gates et al. |
| 10,229,641 B2 | 3/2019 | Yang et al. |
| 10,319,313 B2 | 6/2019 | Harris et al. |
| 10,325,543 B2 | 6/2019 | Hao et al. |
| 10,339,876 B2 | 7/2019 | Lin et al. |
| 10,444,553 B2 | 10/2019 | Laxton |
| 10,565,908 B2 | 2/2020 | Lee |
| 10,672,350 B2 | 6/2020 | Amundson et al. |
| 10,852,568 B2 | 12/2020 | Crounse et al. |
| 11,041,083 B2 | 6/2021 | Bealle et al. |
| 11,062,663 B2 | 7/2021 | Chen et al. |
| 11,100,900 B2 | 8/2021 | Park et al. |
| 11,675,244 B2 | 6/2023 | Visani et al. |
| 2003/0102858 A1 | 6/2003 | Jacobson et al. |
| 2004/0246562 A1 | 12/2004 | Chung et al. |
| 2005/0253777 A1 | 11/2005 | Zehner et al. |
| 2007/0091418 A1 | 4/2007 | Danner et al. |
| 2007/0103427 A1 | 5/2007 | Zhou et al. |
| 2007/0176912 A1 | 8/2007 | Beames et al. |
| 2008/0024429 A1 | 1/2008 | Zehner |
| 2008/0024482 A1 | 1/2008 | Gates et al. |
| 2008/0136774 A1 | 6/2008 | Harris et al. |
| 2008/0303780 A1 | 12/2008 | Sprague et al. |
| 2009/0174651 A1 | 7/2009 | Jacobson et al. |
| 2009/0322721 A1 | 12/2009 | Zehner et al. |
| 2010/0194733 A1 | 8/2010 | Lin et al. |
| 2010/0194789 A1 | 8/2010 | Lin et al. |
| 2010/0220121 A1 | 9/2010 | Zehner et al. |
| 2010/0265561 A1 | 10/2010 | Gates et al. |
| 2011/0063314 A1 | 3/2011 | Chiu et al. |
| 2011/0141082 A1* | 6/2011 | Yamazaki ............ G09G 3/3446 345/107 |
| 2011/0175875 A1 | 7/2011 | Lin et al. |
| 2011/0193840 A1 | 8/2011 | Amundson et al. |
| 2011/0193841 A1 | 8/2011 | Amundson et al. |
| 2011/0199671 A1 | 8/2011 | Amundson et al. |
| 2011/0221740 A1 | 9/2011 | Yang et al. |
| 2012/0001957 A1 | 1/2012 | Liu et al. |
| 2012/0087389 A1* | 4/2012 | Howe ...................... G01K 7/00 374/142 |
| 2012/0098740 A1 | 4/2012 | Chiu et al. |
| 2013/0063333 A1 | 3/2013 | Arango et al. |
| 2013/0249782 A1 | 9/2013 | Wu et al. |
| 2014/0009817 A1 | 1/2014 | Wilcox et al. |
| 2014/0204012 A1 | 7/2014 | Wu et al. |
| 2014/0240210 A1 | 8/2014 | Wu et al. |
| 2014/0253425 A1 | 9/2014 | Zalesky et al. |
| 2014/0293398 A1 | 10/2014 | Wang et al. |
| 2015/0005720 A1 | 1/2015 | Zang et al. |
| 2015/0262255 A1 | 9/2015 | Khajehnouri et al. |
| 2016/0012710 A1 | 1/2016 | Lu et al. |
| 2016/0140910 A1 | 5/2016 | Amundson |
| 2016/0180777 A1 | 6/2016 | Lin et al. |

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991).

Bach, Udo. et al., "Nanomaterials-Based Electrochromics for Paper-Quality Displays", Adv. Mater, vol. 14, No. 11, pp. 845-848, (Jun. 5, 2002).

Hayes, R.A. et al., "Video-Speed Electronic Paper Based on Electrowetting", Nature, vol. 425, No. 25, pp. 383-385 (Sep. 2003).

Kitamura, T. et al., "Electrical toner movement for electronic paper-like display", Asia Display/IDW '01, pp. 1517-1520, Paper HCS1-1 (2001).

Yamaguchi, Y. et al., "Toner display using insulative particles charged triboelectrically", Asia Display/IDW '01, pp. 1729-1730, Paper AMD4-4 (2001).

European Patent Office, "International Search Report and Written Opinion", PCT/US2022/054052, Mar. 6, 2023.

\* cited by examiner

METHODS FOR MEASURING ELECTRICAL PROPERTIES OF ELECTRO-OPTIC DISPLAYS

CROSS-REFERENCE TO RELATED APPLICATIONS

This application is a continuation of U.S. patent application Ser. No. 18/146,608 filed Dec. 27, 2022, which claims priority to U.S. Provisional Patent Application No. 63/293,947 filed Dec. 27, 2021 and U.S. Provisional Patent Application No. 63/301,747 filed Jan. 21, 2022. The entire contents of all of the aforementioned applications are incorporated herein by reference. Further, the entire contents of any patent, published application, or other published work referenced herein are incorporated by reference in their entireties.

FIELD OF THE INVENTION

This invention relates to methods for measuring electrical properties of electro-optic displays. More specifically, this invention relates to methods for measuring electrical properties of active matrix electrophoretic display modules.

BACKGROUND OF THE INVENTION

Electrophoretic display media, generally characterized by the movement of particles through an applied electric field, are highly reflective, can be made bistable, can be scaled to a large area, and consume very little power. Encapsulated electrophoretic displays also enable the display to be printed. These properties allow encapsulated electrophoretic display media to be used in many applications for which traditional electronic displays are not suitable, such as flexible displays.

One particular application for displaying screens are input devices, such as touch screens or keypads, or writing tablets. In many cases, it is desirable to sense the state of the display in order to digitize the input. For example, measuring and analyzing certain properties of the display may enable detection of the location of the input. A responsive event or action may then be generated.

Also, the electrical properties of encapsulated electrophoretic display media may vary in response to environmental factors, such as temperature and humidity. In some circumstances, in order to achieve a repeatable optical state in the display, it may be desirable to compensate the drive waveform in response to changes in electrical properties of the polymeric materials that comprise encapsulated electrophoretic display media. Thus, it is desirable to measure the display parameters that affect waveform compensation scheme. Use of external display sensors, however, may increase cost of the display and complicate the manufacturing process. In addition, external sensors may not accurately measure the parameters inside the display.

SUMMARY OF THE INVENTION

As such, there exists a need to efficiently and accurately measure the electrical properties of a display, and to apply waveforms to the display pixels according to the measured electrical properties.

Accordingly, in one aspect, the subject matter presented herein provides for a method for driving an electro-optic display that includes a layer of electro-optic material disposed between a common electrode and a backplane. The backplane includes an array of pixel electrodes, and each pixel electrode is coupled to a pixel transistor. A display controller circuit applies waveforms to the array of pixel electrodes by applying one or more time-dependent voltages between the common electrode and the array of pixel electrodes via the pixel transistors. The method for driving includes applying first measurement waveforms including one or more frames to a first portion of pixel electrodes of the array of pixel electrodes. During each frame of the first measurement waveforms the same time-dependent voltages are applied to each pixel electrode of the first portion of pixel electrodes. The method also includes measuring a first current flowing through a current measurement circuit coupled between the common electrode and an output of the display controller circuit that applies time-dependent voltages to the common electrode, and determining a first impedance of the electro-optic material in proximity to the first portion of pixel electrodes based on the first current flowing through the current measurement circuit and the time-dependent voltages applied to each pixel electrode of the first portion of pixel electrodes during the first measurement waveforms. The method also includes selecting first driving waveforms to apply to each pixel electrode of the first portion of pixel electrodes based on the first impedance of the electro-optic material in proximity to the first portion of pixel electrodes, and applying the first driving waveforms to the first portion of pixel electrodes. The first driving waveforms comprise time-dependent voltages sufficient to change an optical state of the electro-optic display in proximity to the first portion of pixel electrodes.

In some embodiments, the current measurement circuit includes a resistive element and a differential voltage amplifier, where a first input of the differential voltage amplifier is connected to a first terminal of the resistive element, and a second input of the differential voltage amplifier is connected to a second terminal of the resistive element.

In some embodiments, the time-dependent voltages applied to each pixel electrode of the first portion of pixel electrodes comprise a uniform voltage pulse. In some embodiments, the time-dependent voltages applied to each pixel electrode of the first portion of pixel electrodes include a first voltage pulse having a first polarity, and a second voltage pulse having a second polarity opposite of the first polarity.

In some embodiments, the first portion of pixel electrodes comprises all of the pixel electrodes of the array of pixel electrodes. In some embodiments, the first portion of pixel electrodes includes pixel electrodes located in proximity to an outer perimeter of the array of pixel electrodes.

In some embodiments, the method further includes applying second measurement waveforms including one or more frames to a second portion of pixel electrodes of the array of pixel electrodes, where during each frame of the second measurement waveforms the same time-dependent voltages are applied to each pixel electrode of the second portion of pixel electrodes; measuring a second current flowing through the current measurement circuit; determining a second impedance of the electro-optic material in proximity to the second portion of pixel electrodes based on the second current flowing through the current measurement circuit and the time-dependent voltages applied to each pixel electrode of the first portion of pixel electrodes during the second measurement waveforms; selecting second driving waveforms to apply to each pixel electrode of the second portion of pixel electrodes based on the second impedance of the electro-optic material in proximity to the second portion of pixel electrodes; and applying the second driving waveforms to the second portion of pixel electrodes, where the second driving waveforms comprise time-dependent voltages sufficient to change the optical state of the electro-optic display in proximity to the second portion of pixel electrodes.

In some embodiments, the first portion of pixel electrodes includes pixel electrodes from a first region of the array of pixel electrodes, and the second portion of pixel electrodes includes pixel electrodes from a second region of the array of pixel electrodes, and the first and second regions of pixel electrodes do not overlap. In some embodiments, the method further includes applying zero volt waveforms to the second portion of pixel electrodes while applying first measurement waveforms to the first portion of pixel electrodes, and applying zero volt waveforms to the first portion of pixel electrodes while applying second measurement waveforms to the second portion of pixel electrodes.

In another aspect, the subject matter presented herein provides for a method for driving an electro-optic display including a layer of electro-optic material disposed between a common electrode and a backplane. The backplane includes an array of pixel electrodes, and each pixel electrode is coupled to a pixel transistor. A display controller circuit applies waveforms to the array of pixel electrodes by applying one or more time-dependent voltages between the common electrode and the array of pixel electrodes via the pixel transistors. The method for driving includes concurrently activating pixel transistors associated with a first portion of pixel electrodes of the array of pixel electrodes, and applying a first voltage to the first portion of pixel electrodes. The method for driving also includes injecting measurement waveforms from a signal generation circuit through a current measurement circuit coupled between the signal generation circuit and the common electrode and measuring a first current flowing through the current measurement circuit based on the measurement waveforms. The method for driving also includes determining a first impedance of the electro-optic material in proximity to the first portion of pixel electrodes based on the first current flowing through the current measurement circuit and the time-dependent voltages applied to each pixel electrode of the first portion of pixel electrodes during the first measurement waveforms. The method for driving also includes selecting first driving waveforms to apply to each pixel electrode of the first portion of pixel electrodes based on the first impedance of the electro-optic material in proximity to the first portion of pixel electrodes, and applying the first driving waveforms to the first portion of pixel electrodes, where the first driving waveforms comprise time-dependent voltages sufficient to change an optical state of the electro-optic display in proximity to the first portion of pixel electrodes.

In some embodiments, the current measurement circuit includes a resistive element and a differential voltage amplifier, where a first input of the differential voltage amplifier is connected to a first terminal of the resistive element, and a second input of the differential voltage amplifier is connected to a second terminal of the resistive element.

In some embodiments, the measurement waveforms comprise periodic square or sinusoidal voltage waveforms. In some embodiments, the measurement waveforms comprise voltages having an amplitude insufficient to change an optical state of the electro-optic display. In some embodiments, the measurement waveforms comprise oscillating voltage waveforms having a plurality of frequencies.

In another aspect, the subject matter presented herein provides for a method for driving an electro-optic display including an electrophoretic display medium disposed between a first common electrode and an array of pixel electrodes, where each pixel electrode is coupled to a first terminal of a storage capacitor, and a second terminal of each storage capacitor is coupled to second common electrode. A display controller circuit is configured to apply time-dependent voltages to the first common electrode and the second common electrode independent of one another. The method for driving includes concurrently activating pixel transistors associated with a first portion of pixel electrodes. The method for driving also includes toggling a first switch to disconnect the first common electrode from the display controller circuit and to connect the first common electrode to a first terminal of an impedance measurement circuit, and toggling a second switch to disconnect the second common electrode from the display controller circuit and to connect the second common electrode to a second terminal of the impedance measurement circuit. The method for driving also includes injecting measurement waveforms voltages from the impedance measurement circuit into the first common electrode, where the measurement waveforms including time-dependent voltages. The method for driving also includes measuring a first current flowing through the impedance measurement circuit based on the measurement waveforms, and determining a first impedance of the electro-optic material in proximity to the first portion of pixel electrodes based on the first current flowing through the impedance measurement circuit and the time-dependent voltages applied to the first common electrode during the measurement waveforms. The method for driving also includes selecting first driving waveforms to apply to each pixel electrode of the first portion of pixel electrodes based on the first impedance of the electro-optic material in proximity to the first portion of pixel electrodes. The method for driving also includes toggling the first switch to disconnect the first common electrode from the impedance measurement circuit and to connect the first common electrode to the display controller circuit, and toggling the second switch to disconnect the second common electrode from the impedance measurement circuit and to connect the second common electrode to the display controller circuit. The method for driving also includes applying the first driving waveforms to the first portion of pixel electrodes, where the first driving waveforms comprise time-dependent voltages sufficient to change an optical state of the electro-optic display in proximity to the first portion of pixel electrodes.

In some embodiments, the measurement waveforms comprise periodic square or sinusoidal voltage waveforms. In some embodiments, the measurement waveforms include voltages having an amplitude insufficient to change an optical state of the electro-optic display in proximity to the first portion of pixel electrodes. In some embodiments, the measurement waveforms comprise voltages having an amplitude less than one volt. In some embodiments, the measurement waveforms include oscillating voltage waveforms having a plurality of frequencies.

In some embodiments, the first portion of pixel electrodes includes pixel electrodes located in proximity to an outer perimeter of the array of pixel electrodes.

DETAILED DESCRIPTION OF THE INVENTION

Figure 2:
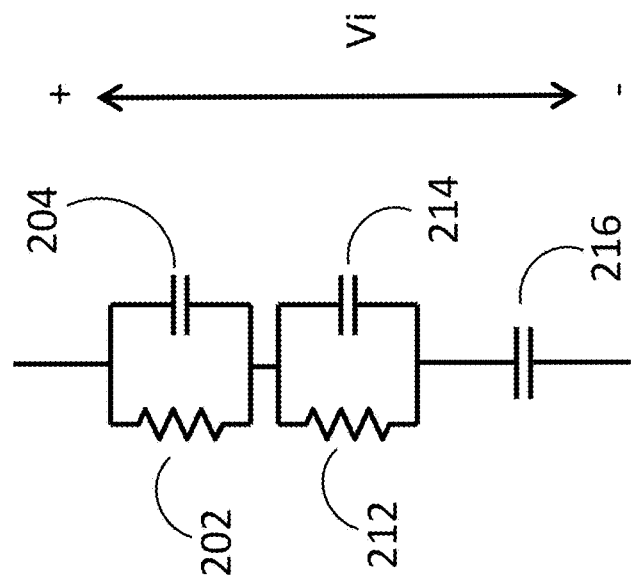
FIG. 2 shows a circuit model of the electro-optic imaging layer in accordance with the subject matter described herein.

The present invention relates to methods for driving electro-optic displays, especially bistable electro-optic displays, and to apparatus for use in such methods. More specifically, this invention relates to driving methods which may allow for reduced "ghosting" and edge effects, and reduced flashing in such displays. This invention is especially, but not exclusively, intended for use with particle-based electrophoretic displays in which one or more types of electrically charged particles are present in a fluid and are moved through the fluid under the influence of an electric field to change the appearance of the display.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example, the aforementioned white and dark blue states. The term "monochrome" may be used hereinafter to denote a drive scheme which only drives pixels to their two extreme optical states with no intervening gray states.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "impulse" is used herein in its conventional meaning of the integral of voltage with respect to time. However, some bistable electro-optic media act as charge transducers, and with such media an alternative definition of impulse, namely the integral of current over time (which is equal to the total charge applied) may be used. The appropriate definition of impulse should be used, depending on whether the medium acts as a voltage-time impulse transducer or a charge impulse transducer.

Much of the discussion below will focus on methods for driving one or more pixels of an electro-optic display through a transition from an initial gray level to a final gray level (which may or may not be different from the initial gray level). The term "waveform" will be used to denote the entire voltage against time curve used to effect the transition from one specific initial gray level to a specific final gray level. Typically such a waveform will comprise a plurality of waveform elements; where these elements are essentially rectangular (i.e., where a given element comprises application of a constant voltage for a period of time); the elements may be called "pulses" or "drive pulses". The term "drive scheme" denotes a set of waveforms sufficient to effect all possible transitions between gray levels for a specific display. A display may make use of more than one drive scheme; for example, the aforementioned U.S. Pat. No. 7,012,600 teaches that a drive scheme may need to be modified depending upon parameters such as the temperature of the display or the time for which it has been in operation during its lifetime, and thus a display may be provided with a plurality of different drive schemes to be used at differing temperature etc. A set of drive schemes used in this manner may be referred to as "a set of related drive schemes." It is also possible, as described in several of the aforementioned MEDEOD applications, to use more than one drive scheme simultaneously in different areas of the same display, and a set of drive schemes used in this manner may be referred to as "a set of simultaneous drive schemes."

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Microcell structures, wall materials, and methods of forming microcells; see for example U.S. Pat. Nos. 7,072,095 and 9,279,906;

(d) Methods for filling and sealing microcells; see for example U.S. Pat. Nos. 7,144,942 and 7,715,088;

(e) Films and sub-assemblies containing electro-optic materials; see for example U.S. Pat. Nos. 6,982,178 and 7,839,564;

(f) Backplanes, adhesive layers and other auxiliary layers and methods used in displays; see for example U.S. Pat. Nos. 7,116,318 and 7,535,624;

(g) Color formation and color adjustment; see for example U.S. Pat. Nos. 7,075,502 and 7,839,564.

(h) Applications of displays; see for example U.S. Pat. Nos. 7,312,784; 8,009,348;

(i) Non-electrophoretic displays, as described in U.S. Pat. No. 6,241,921 and U.S. Patent Application Publication No. 2015/0277160; and applications of encapsulation and microcell technology other than displays; see for example U.S. Patent Application Publications Nos. 2015/0005720 and 2016/0012710; and (j) Methods for driving displays; see for example U.S. Pat. Nos. 5,930,026; 6,445,489; 6,504,524; 6,512,354; 6,531,997; 6,753,999; 6,825,970; 6,900,851; 6,995,550; 7,012,600; 7,023,420; 7,034,783; 7,061,166; 7,061,662; 7,116,466; 7,119,772; 7,177,066; 7,193,625; 7,202,847; 7,242,514; 7,259,744; 7,304,787; 7,312,794; 7,327,511; 7,408,699; 7,453,445; 7,492,339; 7,528,822; 7,545,358; 7,583,251; 7,602,374; 7,612,760; 7,679,599; 7,679,813; 7,683,606; 7,688,297; 7,729,039; 7,733,311; 7,733,335; 7,787,169; 7,859,742; 7,952,557; 7,956,841; 7,982,479; 7,999,787; 8,077,141; 8,125,501; 8,139,050; 8,174,490; 8,243,013; 8,274,472; 8,289,250; 8,300,006; 8,305,341; 8,314,784; 8,373,649; 8,384,658; 8,456,414; 8,462,102; 8,537,105; 8,558,783; 8,558,785; 8,558,786; 8,558,855; 8,576,164; 8,576,259; 8,593,396; 8,605,032; 8,643,595; 8,665,206; 8,681,191; 8,730,153; 8,810,525; 8,928,562; 8,928,641; 8,976,444; 9,013,394; 9,019,197; 9,019,198; 9,019,318; 9,082,352; 9,171,508; 9,218,773; 9,224,338; 9,224,342; 9,224,344; 9,230,492; 9,251,736; 9,262,973; 9,269,311; 9,299,294; 9,373,289; 9,390,066; 9,390,661; and 9,412,314; and U.S. Patent Applications Publication Nos. 2003/0102858; 2004/0246562; 2005/0253777; 2007/0070032; 2007/0076289; 2007/0091418; 2007/0103427; 2007/0176912; 2007/0296452; 2008/0024429; 2008/0024482; 2008/0136774; 2008/0169821; 2008/0218471; 2008/0291129; 2008/0303780; 2009/0174651; 2009/0195568; 2009/0322721; 2010/0194733; 2010/0194789; 2010/0220121; 2010/0265561; 2010/0283804; 2011/0063314; 2011/0175875; 2011/0193840; 2011/0193841; 2011/0199671; 2011/0221740; 2012/0001957; 2012/0098740; 2013/0063333; 2013/0194250; 2013/0249782; 2013/0321278; 2014/0009817; 2014/0085355; 2014/0204012; 2014/0218277; 2014/0240210; 2014/0240373; 2014/0253425; 2014/0292830; 2014/0293398; 2014/0333685; 2014/0340734; 2015/0070744; 2015/0097877; 2015/0109283; 2015/0213749; 2015/0213765; 2015/0221257; 2015/0262255; 2016/0071465; 2016/0078820; 2016/0093253; 2016/0140910; and 2016/0180777.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

A related type of electrophoretic display is a so-called "microcell electrophoretic display." In a microcell electrophoretic display, the charged particles and the suspending fluid are not encapsulated within microcapsules but instead are retained within a plurality of cavities formed within a carrier medium, e.g., a polymeric film. See, for example, International Application Publication No. WO 02/01281, and published U.S. Application No. 2002/0075556, both assigned to Sipix Imaging, Inc.

Many of the aforementioned E Ink and MIT patents and applications also contemplate microcell electrophoretic displays and polymer-dispersed electrophoretic displays. The term "encapsulated electrophoretic displays" can refer to all such display types, which may also be described collectively as "microcavity electrophoretic displays" to generalize across the morphology of the walls.

Another type of electro-optic display is an electro-wetting display developed by Philips and described in Hayes, R. A., et al., "Video-Speed Electronic Paper Based on Electrowetting," Nature, 425, 383-385 (2003). It is shown in copending application Ser. No. 10/711,802, filed Oct. 6, 2004, that such electro-wetting displays can be made bistable.

Other types of electro-optic materials may also be used. Of particular interest, bistable ferroelectric liquid crystal displays (FLCs) are known in the art and have exhibited remnant voltage behavior.

Although electrophoretic media may be opaque (since, for example, in many electrophoretic media, the particles substantially block transmission of visible light through the display) and operate in a reflective mode, some electrophoretic displays can be made to operate in a so-called "shutter mode" in which one display state is substantially opaque and one is light-transmissive. See, for example, the patents U.S. Pat. Nos. 6,130,774 and 6,172,798, and 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode.

A high-resolution display may include individual pixels which are addressable without interference from adjacent pixels. One way to obtain such pixels is to provide an array of non-linear elements, such as transistors or diodes, with at least one non-linear element associated with each pixel, to produce an "active matrix" display. An addressing or pixel electrode, which addresses one pixel, is connected to an appropriate voltage source through the associated non-linear element. When the non-linear element is a transistor, the pixel electrode may be connected to the drain of the transistor, and this arrangement will be assumed in the following description, although it is essentially arbitrary and the pixel electrode could be connected to the source of the transistor. In high-resolution arrays, the pixels may be arranged in a two-dimensional array of rows and columns, such that any specific pixel is uniquely defined by the intersection of one specified row and one specified column. The sources of all the transistors in each column may be connected to a single column electrode, while the gates of all the transistors in each row may be connected to a single row electrode; again the assignment of sources to rows and gates to columns may be reversed if desired.

The display may be written in a row-by-row manner. The row electrodes are connected to a row driver, which may apply to a selected row electrode a voltage such as to ensure that all the transistors in the selected row are conductive, while applying to all other rows a voltage such as to ensure that all the transistors in these non-selected rows remain non-conductive. The column electrodes are connected to column drivers, which place upon the various column electrodes voltages selected to drive the pixels in a selected row to their desired optical states. (The aforementioned voltages are relative to a common front electrode which may be provided on the opposed side of the electro-optic medium from the non-linear array and extends across the whole display. As in known in the art, voltage is relative and a measure of a charge differential between two points. One voltage value is relative to another voltage value. For example, zero voltage ("0V") refers to having no voltage differential relative to another voltage.) After a pre-selected interval known as the "line address time," a selected row is deselected, another row is selected, and the voltages on the column drivers are changed so that the next line of the display is written.

An Exemplary EPD

Figure 1:
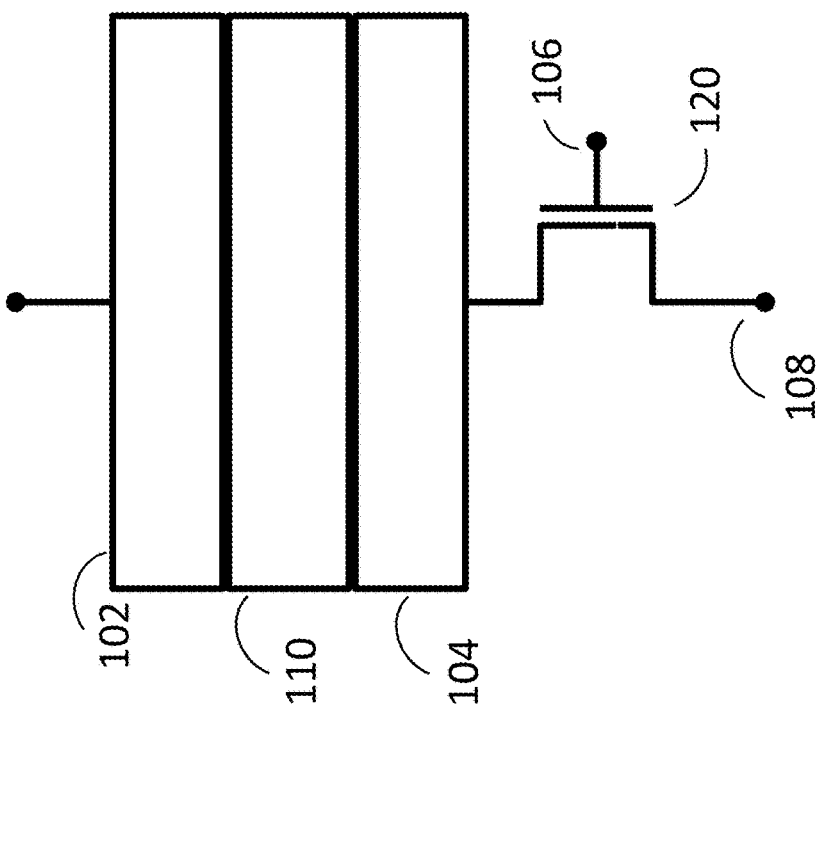
FIG. 1 is a circuit diagram representing an electrophoretic display in accordance with the subject matter described herein.

FIG. 1 shows a schematic of a pixel 100 of an electrophoretic display or EPD in accordance with the subject matter submitted herein. Pixel 100 may include an imaging film 110. In some embodiments, imaging film 110 may be bistable. In some embodiments, imaging film 110 may include, without limitation, an encapsulated electrophoretic imaging film, which may include, for example, charged pigment particles.

Imaging film 110 may be disposed between a front electrode 102 and a rear electrode 104. Front electrode 102 may be formed between the imaging film and the front of the display. In some embodiments, front electrode 102 may be transparent. In some embodiments, front electrode 102 may be formed of any suitable transparent material, including, without limitation, indium tin oxide (ITO). Rear electrode 104 may be formed opposite a front electrode 102. In some embodiments, a parasitic capacitance (not shown) may be formed between front electrode 102 and rear electrode 104.

Pixel 100 may be one of a plurality of pixels. The plurality of pixels may be arranged in a two-dimensional array of rows and columns to form a matrix, such that any specific pixel is uniquely defined by the intersection of one specified row and one specified column. In some embodiments, the matrix of pixels may be an "active matrix," in which each pixel is associated with at least one non-linear circuit element 120. The non-linear circuit element 120 may be coupled between back-plate electrode 104 and an addressing electrode 108. In some embodiments, non-linear element 120 may include a diode and/or a transistor, including, without limitation, a MOSFET. The drain (or source) of the MOSFET may be coupled to back-plate electrode 104, the source (or drain) of the MOSFET may be coupled to addressing electrode 108, and the gate of the MOSFET may be coupled to a driver electrode 106 configured to control the activation and deactivation of the MOSFET. (For simplicity, the terminal of the MOSFET coupled to back-plate electrode 104 will be referred to as the MOSFET's drain, and the terminal of the MOSFET coupled to addressing electrode 108 will be referred to as the MOSFET's source. However, one of ordinary skill in the art will recognize that, in some embodiments, the source and drain of the MOSFET may be interchanged.)

In some embodiments of the active matrix, the addressing electrodes 108 of all the pixels in each column may be connected to a same column electrode, and the driver electrodes 106 of all the pixels in each row may be connected to a same row electrode. The row electrodes may be connected to a row driver, which may select one or more rows of pixels by applying to the selected row electrodes a voltage sufficient to activate the non-linear elements 120 of all the pixels 100 in the selected row(s). The column electrodes may be connected to column drivers, which may place upon the addressing electrode 106 of a selected (activated) pixel a voltage suitable for driving the pixel into a desired optical state. The voltage applied to an addressing electrode 108 may be relative to the voltage applied to the pixel's front-plate electrode 102 (e.g., a voltage of approximately zero volts). In some embodiments, the front-plate electrodes 102 of all the pixels in the active matrix may be coupled to a common electrode.

In some embodiments, the pixels 100 of the active matrix may be written in a row-by-row manner. For example, a row of pixels may be selected by the row driver, and the voltages corresponding to the desired optical states for the row of pixels may be applied to the pixels by the column drivers. After a pre-selected interval known as the "line address time," the selected row may be deselected, another row may be selected, and the voltages on the column drivers may be changed so that another line of the display is written.

FIG. 2 shows a circuit model of the electro-optic imaging layer 110 disposed between the front electrode 102 and the rear electrode 104 in accordance with the subject matter presented herein. Resistor 202 and capacitor 204 may represent the resistance and capacitance of the electro-optic imaging layer 110, the front electrode 102 and the rear electrode 104, including any adhesive layers. Resistor 212 and capacitor 214 may represent the resistance and capacitance of a lamination adhesive layer. Capacitor 216 may represent a capacitance that may form between the front electrode 102 and the back electrode 104, for example, interfacial contact areas between layers, such as the interface between the imaging layer and the lamination adhesive layer and/or between the lamination adhesive layer and the back-plane electrode. A voltage Vi across a pixel's imaging film 110 may include the pixel's remnant voltage It has been observed that the performance of an electrophoretic display can vary according to environmental conditions. For example, variations in the impedance of the front panel laminate ("FPL") can be correlated to fluctuations in temperature. Accordingly, impedance measurements, such as measurements of the front plane laminate impedance, can provide useful insight into operational characteristics of an electrophoretic display and the display's ink system.

Figure 3:
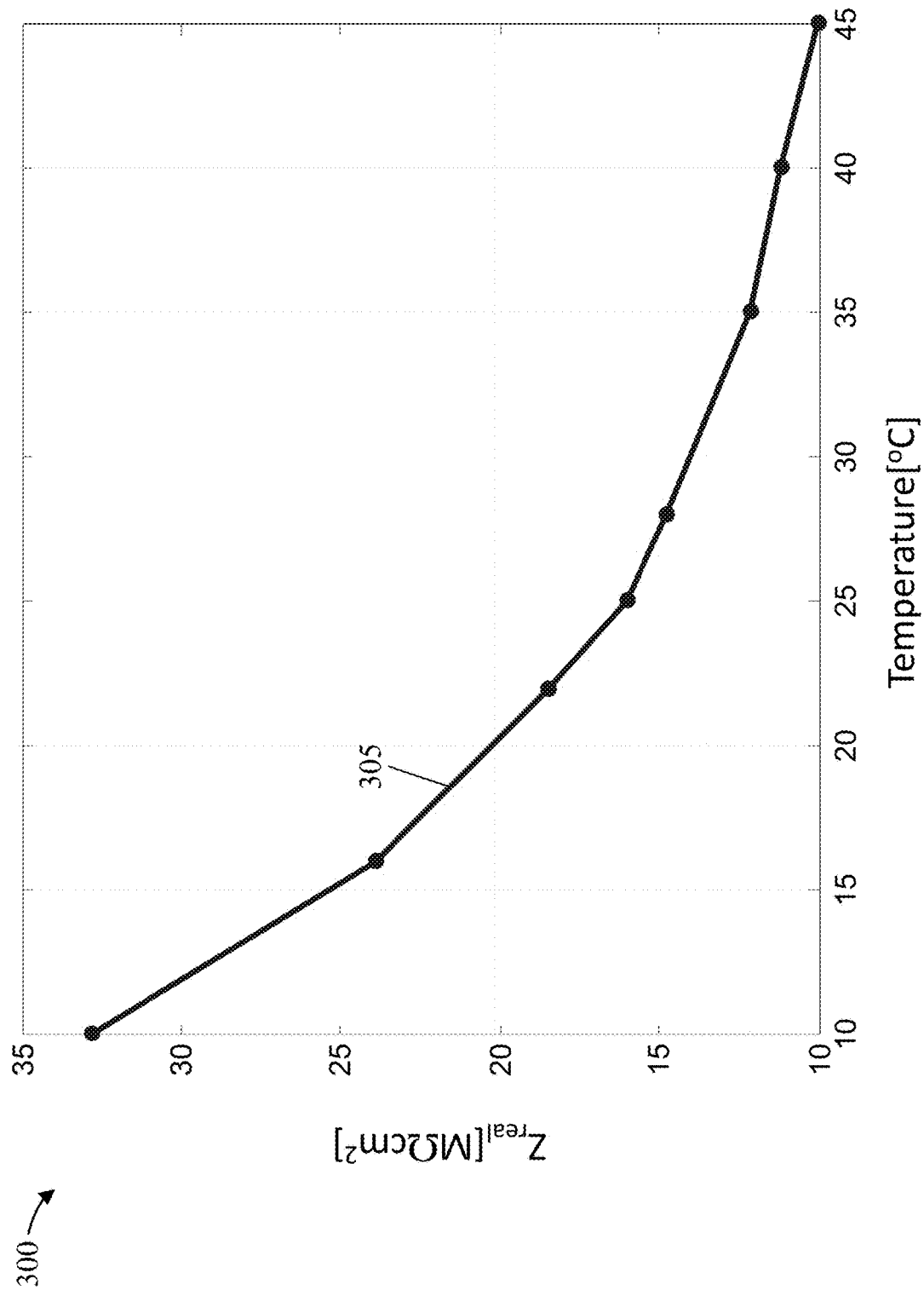
FIG. 3 is a graph showing a plot of the impedance of an exemplary front plane laminate or "FPL" versus temperature in accordance with the subject matter described herein.

FIG. 3 is a graph 300 showing a plot 305 of the impedance of an exemplary front plane laminate versus temperature. In particular, graph 300 shows a plot 305 of the FPL impedance $Z_{real}$ in $M\Omega cm^2$ at 10 Hz on the Y-axis versus temperature in Celsius on the x-axis. As illustrated by graph 300, FPL impedance decreases as temperature increases. It should be appreciated that the FPL referred to herein may include, but is not limited to, an electrophoretic display's light transmissive electrically conductive layer, a layer of an electro-optic medium, and an adhesive layer. In some embodiments, this impedance measurement information may be used instead of temperature measurements for waveform selection to optimize display performance.

Figure 4A:
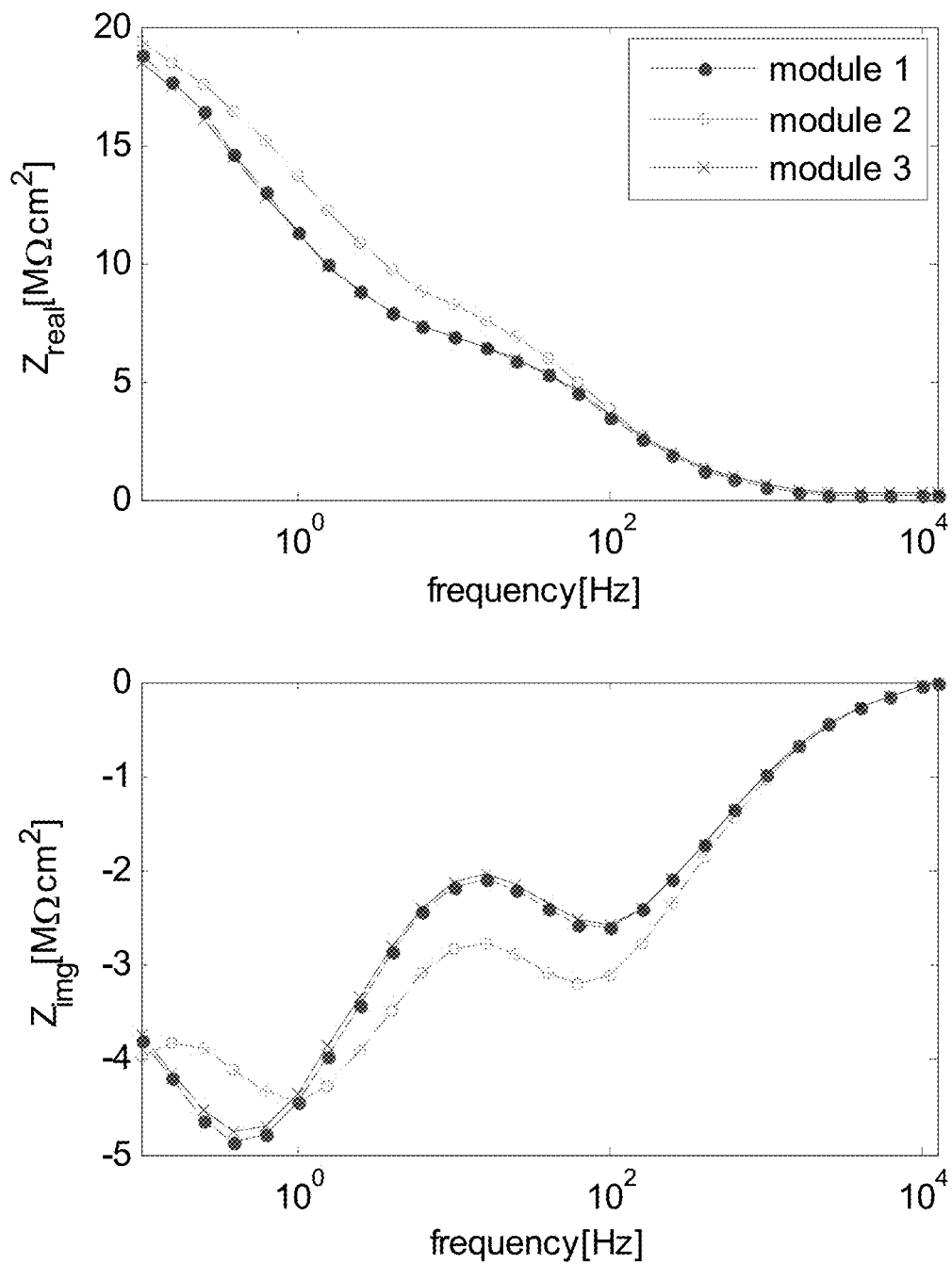
FIG. 4A shows two plots of exemplary impedance measurements performed on three exemplary display modules in accordance with the subject matter described herein.

FIG. 4A shows two plots of exemplary impedance measurements performed on three exemplary display modules across different waveform frequencies at 28° C. are shown, where two of the modules, 1 and 3, have very similar impedances, while module 2 shows a different impedance than the other two.

Figure 4B:
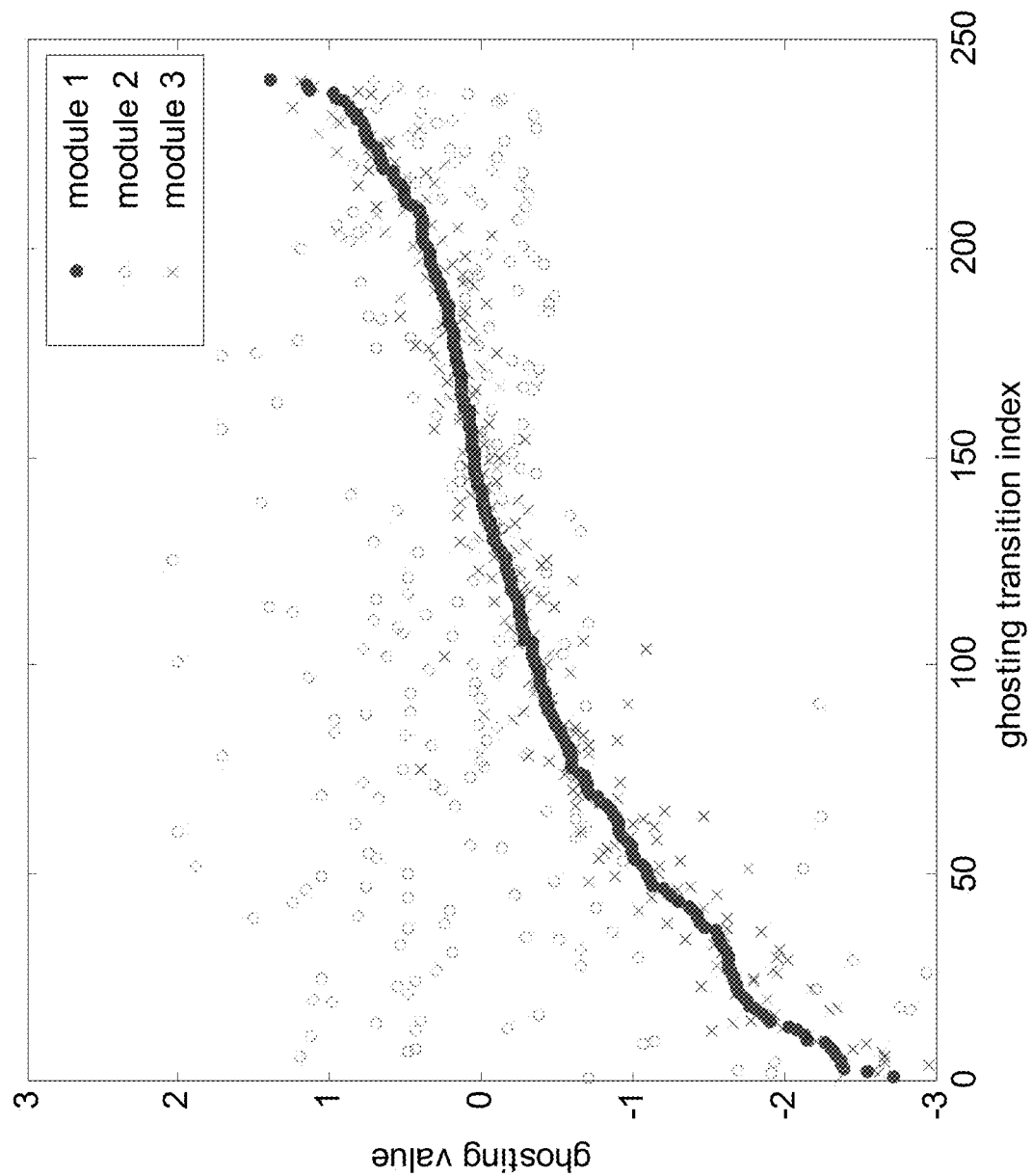
FIG. 4B is a plot showing the ghosting performance during different graytone transitions in accordance with the subject matter described herein.

FIG. 4B is a plot showing the ghosting performance during different graytone transitions, for example a display capable of four-bit, 16 gray levels denoted from 1 (black) to 16 (white) with transitions (e.g., {GT1, GT2, . . . , GT15}→{GT1, GT2, . . . , GT16}) using the same driving waveforms as were used for FIG. 4A at 28° C. The x-axis of this figure indicates the different graytone transitions. As shown, the ghosting performance of module 1 is fairly similar to module 3 with module 2 having a very different ghosting performance. The ghosting results correlate to the impedance measurements shown in FIG. 4A. As such, it can be inferred that impedance measurements can be used as a measure of optical performance, and that modules having similar impedance behave similarly optically and can thus be driven similarly.

Figure 5:
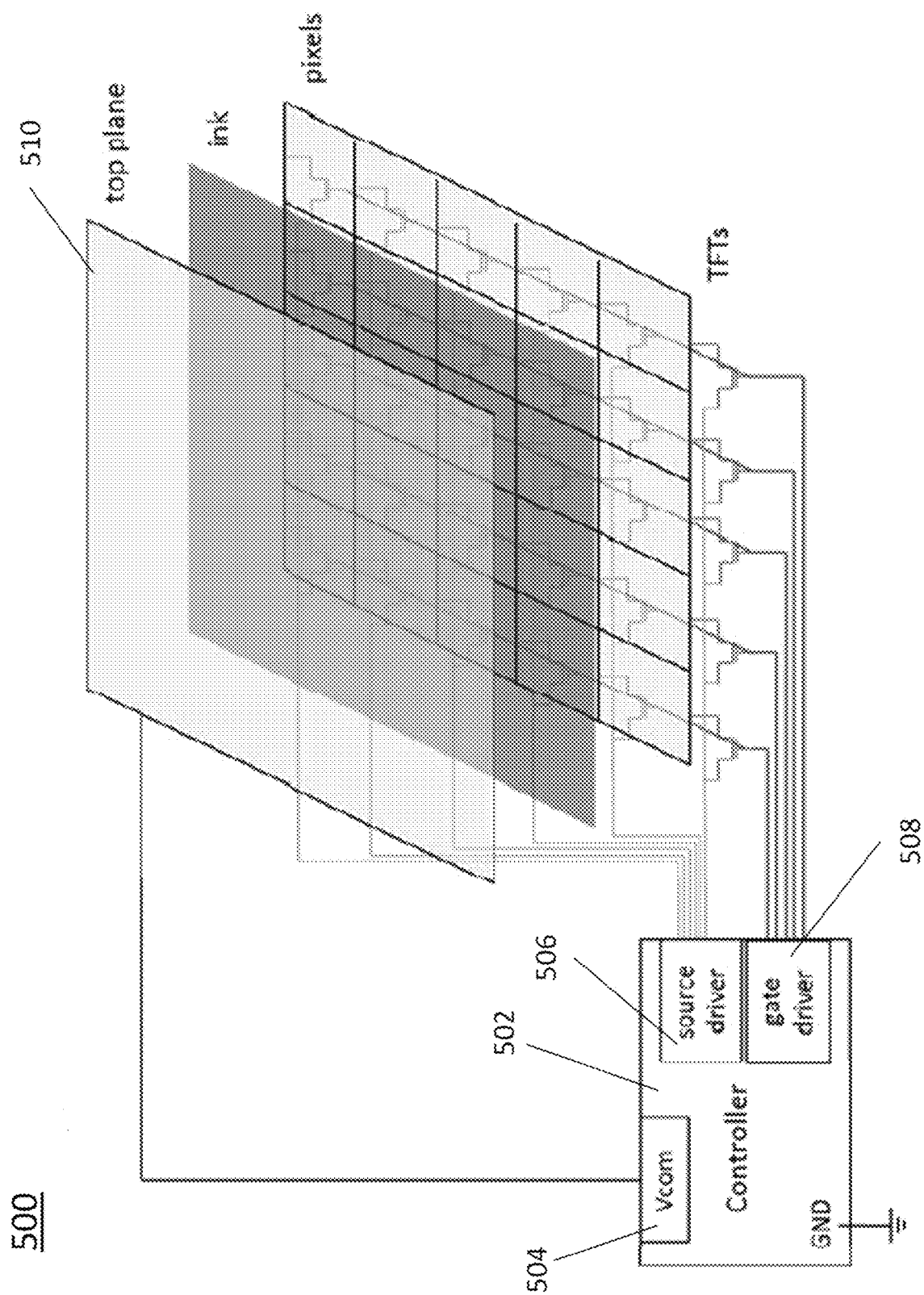
FIG. 5 illustrates a diagram of an embodiment of an electrophoretic display in accordance with the subject matter described herein.

FIG. 5 illustrates a diagram of an electrophoretic display 500. In this embodiment, a controller's 502 output synchronized source 506 and gate 508 line voltage to scan the display pixels sequentially. A DC voltage may be supplied through the Vcom 504 line to a top plane 510 during each update.

In practice, it may be desirable to access the pixel electrodes of an active matrix display using external instruments to measure electrical properties directly by applying signals. Depending on what signal is used as input, the electrical properties measured can include, but are not limited to, current, resistance, charge, capacitance, time constants, phase shifts, magnitude and frequency peaks.

Figure 6:
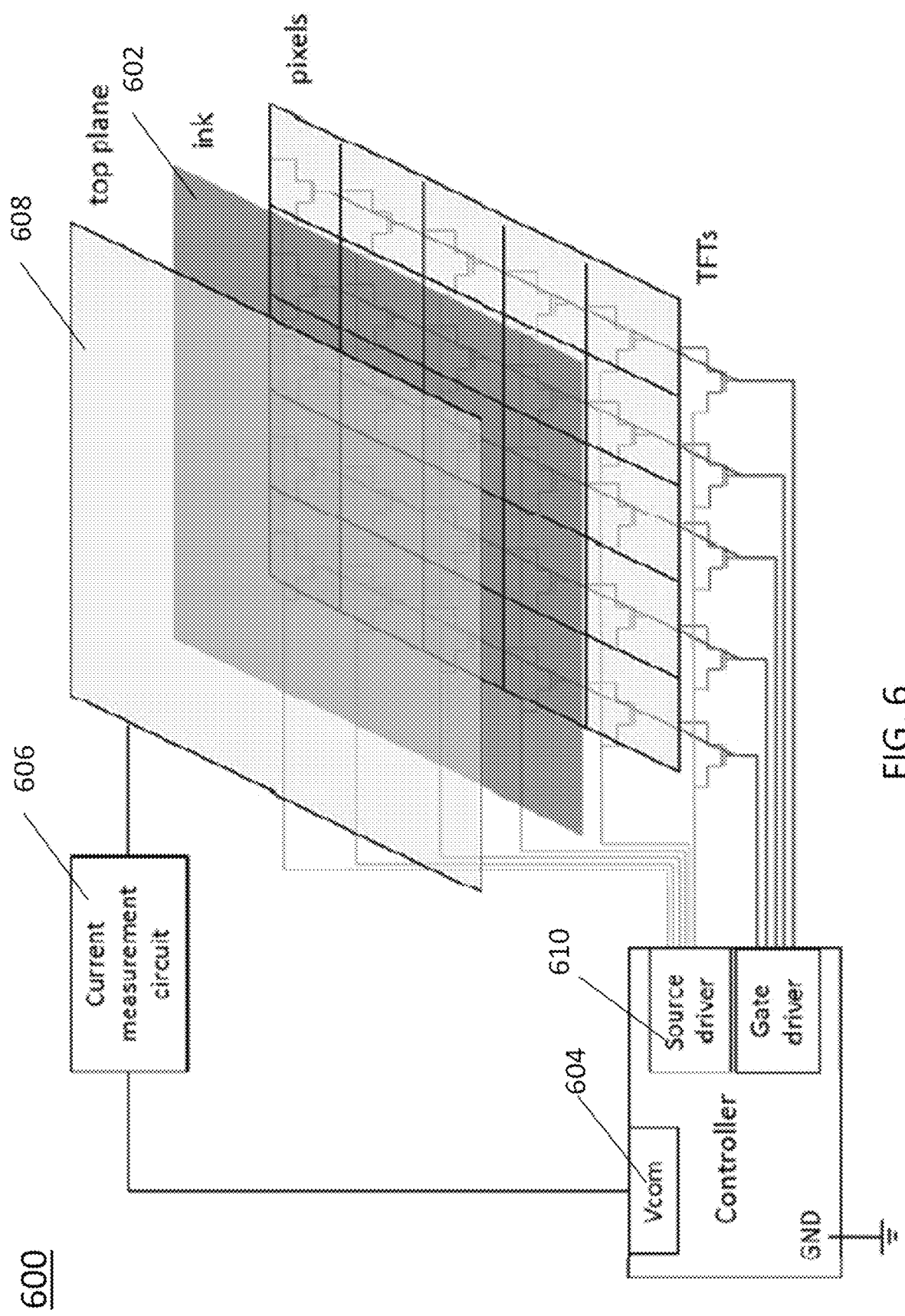
FIG. 6 illustrates a diagram of an embodiment of an electrophoretic display in accordance with the subject matter described herein.

Referring now to FIG. 6, one method to measure the electrical properties is to update an active matrix display 600 using a known waveform while measuring the ink layer's 602 electrical response through the common electrode. In this method, the voltage applied to all the pixel electrodes during each frame is the same. Therefore, at the end of each frame a uniform electric field may be formed across the ink within the display area updated. The electrical response measured through the common electrode can thus reflect the average electrical properties of the updated area. For example, the pixels of the active-matrix backplane may be brought to a non-zero voltage while the current through the Vcom 604 line is measured. The current transient during and just after a voltage pulse on the backplane can reveal area-averaged electrical properties of the display 600 such as properties related to sheet resistance and sheet capacitance. In this configuration, since the waveform is applied to the pixels by the source and gate drivers in the controller, this method can be used when the active matrix display 400 is operating under a normal scanning mode.

As illustrated in FIG. 6, a current measurement circuit 606 may be inserted between the Vcom line 604 and the top plane electrode 608. In some embodiments, this current measure circuit may include a small resistance (e.g., approximately 500 ohms) and a differential voltage amplifier with an input line applied across the resistor. In this configuration, the resistance of the resistor may be small enough to not substantially affect display's 600 operation, but large enough to give a voltage signal in proportion to the current running through the Vcom line 604. In operation, as the display 600 is updated, the waveform and image are selected so that the same time-dependent voltage is applied to all pixels. This time-dependent voltage may be a simple voltage pulse, for example, a uniform voltage applied for a finite length of time. In another embodiment, the time-dependent voltage may include two consecutive pulses of opposite amplitude. The current may be measured as a function of time across the entire display addressing event. The current over a time period covering a portion of the latter part of each pulse may be averaged. The value is, in an approximated way, proportional to an effective resistance or impedance of the display film. This effective impedance may be correlated to electro-optical behavior of the display film, and so, may be used to select an appropriate waveform for updating in standard display operation. This measurement method offers the flexibility to perform selective regional or local measurements while not affecting the normal scanning operations of the display.

In another embodiment, a fraction of the display pixels may be driven while the current through the Vcom 604 line is measured. In this configuration, the current transient gives area-averaged electrical properties of the display, but only averaged over the area of the pixels that are driven. In this instance, "drive" is defined such that the driven pixels are receiving a non-zero voltage while the rest of the pixels are not driven, that is, the non-driven pixels receive zero voltage bias. In this fashion, the electrical properties of just the left half of the display 600 can be measured by applying a non-zero voltage to pixels of only the left half of the display and measuring the current through the Vcom 604 line. Of course, one this example can be extended to measure electrical properties of any sub-area of the display by selecting pixels to receive non-zero voltage in just that area. This configuration can also be extended to driving a non-contiguous set of display pixels.

In operation, various waveforms may be adopted to perform the area-specific electrical measurements. "Waveform" is defined herein as a set of voltage lists to make transitions from graytone of one grayscale to a graytone of the same or different grayscale. In some embodiments, electrical properties measured in a certain area of a display can be used as input to select an appropriate waveform to be applied to that area of the display. This can be done for multiple areas of a display, and various waveforms may be chosen to make desired transitions in various regions of a display. For example, a full waveform file may contain many temperature-appropriate waveforms designed to make desirable transitions across specific temperature bands, with one waveform for each temperature band. In some embodiments, an input from a temperature sensor may be used to select an appropriate waveform for a measured temperature. For example, a controller could take as input both the temperature and region-specific electrical information. The region-specific electrical information could be used to give information about temperature differences between various parts of the display and one could shift which waveform gets applied to various parts of the display based upon the electrical measurements. When an electrical measurement gives an indication that there is a temperature difference between a left and right half of a display, this information could be used to select two different waveforms, one for the left half of the display and one for the right, based upon an estimate of the temperature difference inferred from region-specific electrical measurements. One could also extend this concept to select waveforms based solely upon electrical measurements, that is, a temperature sensor would not need to be used.

In one embodiment, source drivers 610 may be used to drive the "driven pixels" at voltages sufficiently low that the electrical measurements do not significantly perturb the display image. In another embodiment, electrical measurements may be made using very short voltage pulses so the display image is not substantially perturbed during the electrical measurements. In yet another embodiment, the seam between two adjacent regions where two distinct waveforms are applied may be "blurred" through a dither mask between the two regions, where the dither pattern determines which pixels receive which of the two waveforms. The dither can be set up to provide a gradient from one region where all pixels receive one waveform and the adjacent region where all pixels receive a second waveform, with a smooth transition in the local fraction of pixels receiving each of the two waveforms across the region of dithering.

As such, when a display has substantial temperature differences across its surface, and where a single waveform applied across the entire display would have given undesirable performance, using the driving methods or schemes described herein enables a selection of various waveforms to be applied to various fractions of a display surface to compensate for temperature variations across the display surface.

Figure 7:
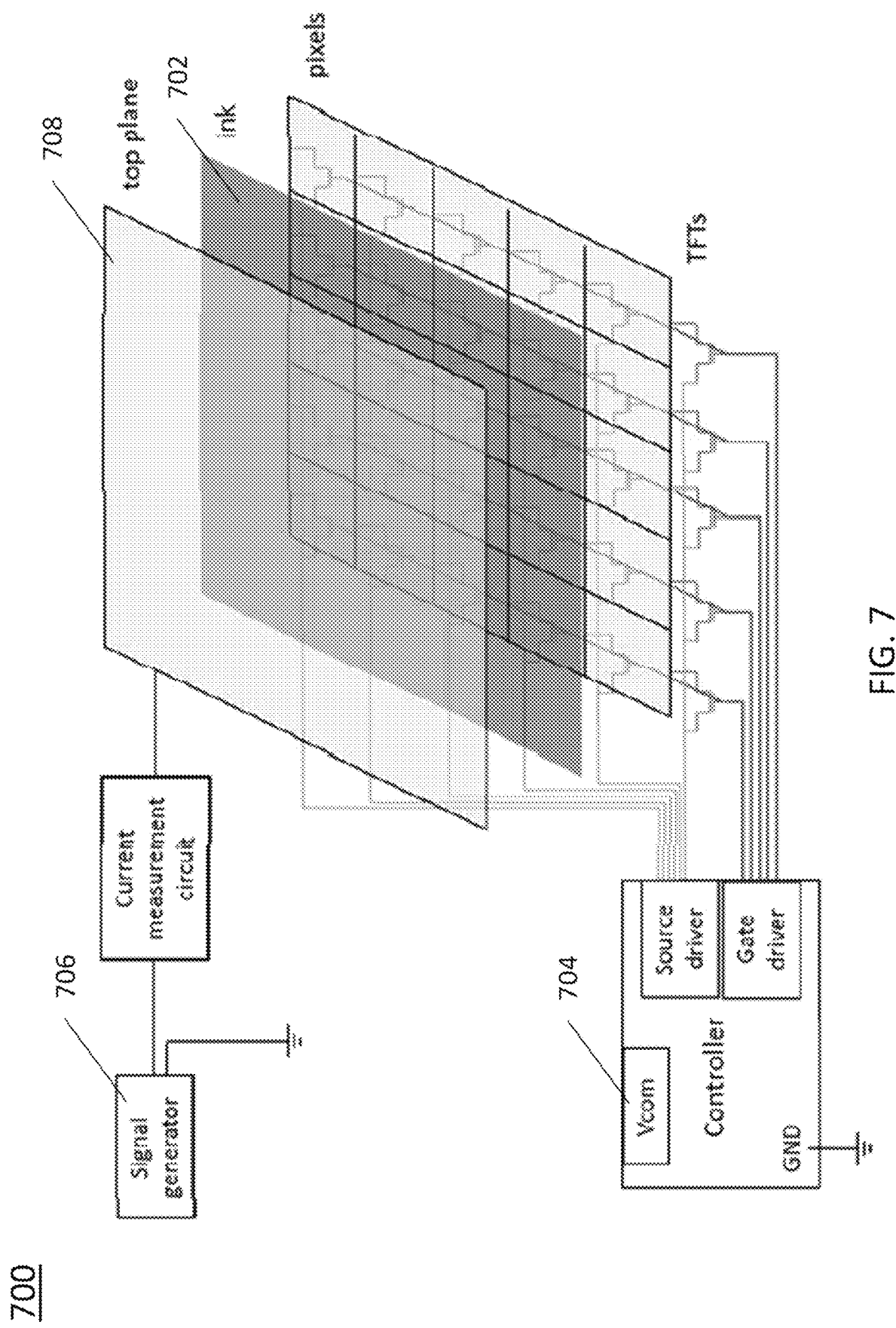
FIG. 7 illustrates a diagram of an embodiment of an electrophoretic display in accordance with the subject matter described herein.

In another method, referring now to FIG. 7, an active matrix display 700 may be updated using an external source through the common electrode, and the electrical response of the ink 702 may be measured on the same Vcom line 704. A known voltage signal may be injected through the common electrode, while all the pixel electrodes are connected to a known voltage, for example, a ground. To close the circuit loop, all the TFTs of the active matrix are turned on simultaneously. In this configuration, all the display electrodes can be treated as one single electrode covering the entire display area. More flexibility is gained in this method because an arbitrary signal can be applied to the common electrode without the limitations due to the scanning operation requirements. From the signal generator 706 output and the measured electrical response one can deduce the electrical properties of the electrophoretic layers.

In use, by way of example, a low-amplitude voltage may be applied by the signal generator 706 shown in FIG. 7 to the top plane 708. This voltage may be of sufficiently low in amplitude such that it does not perturb the optical state of the display to a degree that is apparent to a casual observer, and yet large enough to allow for a sufficient signal-to-noise ratio for the current measurement to give reliable information. In some embodiments, voltages in the 10-100 mV range may be used here. In another embodiment, an oscillating voltage may be applied over a finite time, for example, a 50 mV, one-Hertz square wave or a sinusoidal wave. The in-phase portion of the current can be measured to give a value that correlates to an effective resistance of the display. Where this effective resistance may be correlated to electro-optical behavior of the display film, and by doing so, may be used to select an appropriate waveform for updating in standard display operation. For example, if sinusoids of different frequencies is applied to the top plane 708, at each frequency one may calculate the impedance of the display 700 from the electrical response.

Figure 8:
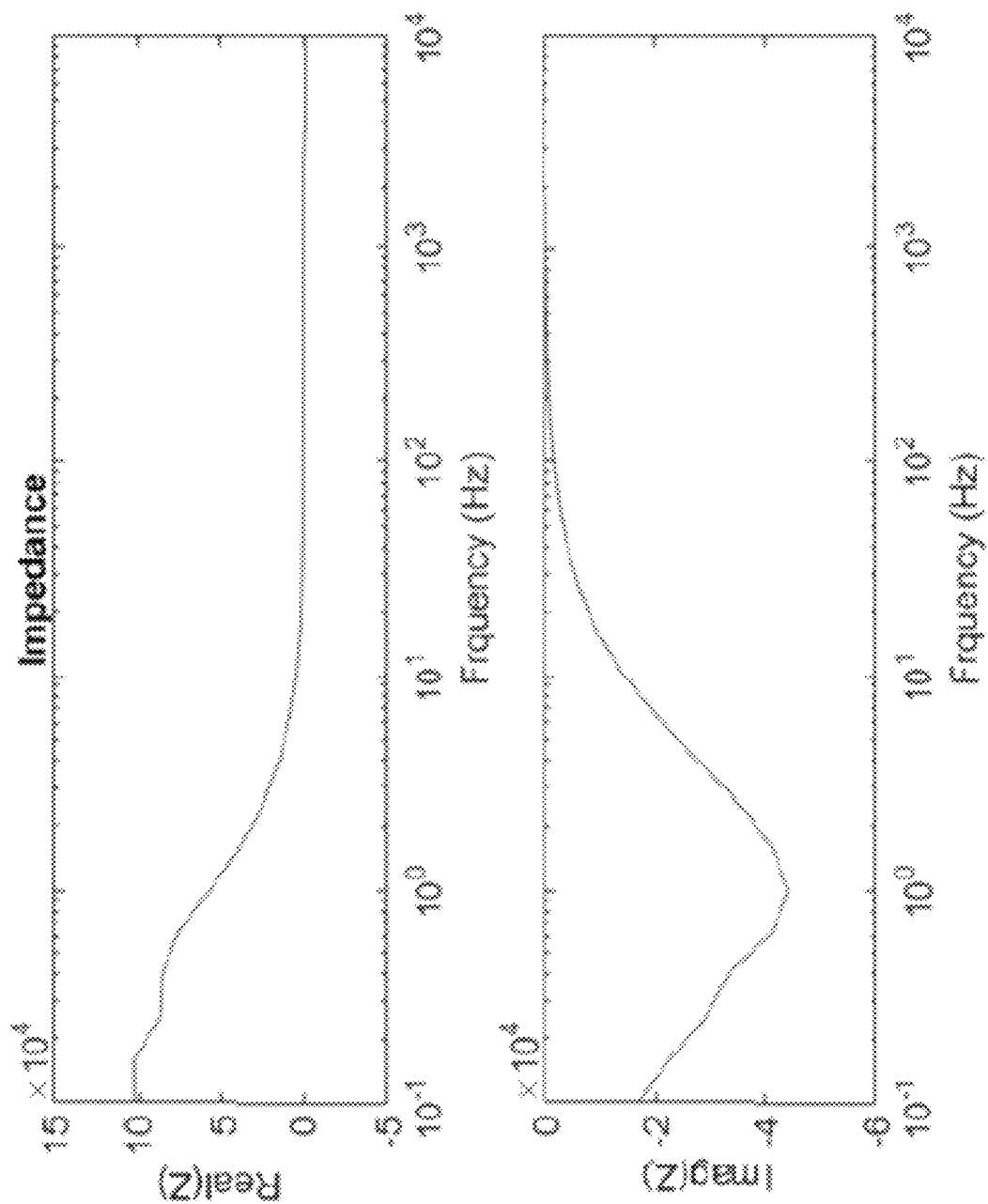
FIG. 8 shows a set of impedance measurement results from an exemplary active matrix display module using the method described herein.

FIG. 8 shows a set of impedance measurement results from an exemplary active matrix display module using the method described herein. The setup described herein provides a flexibility on what type of input signal may be used and what electrical properties may be measured, and can be easily performed to measure the entire display module.

Figure 9:
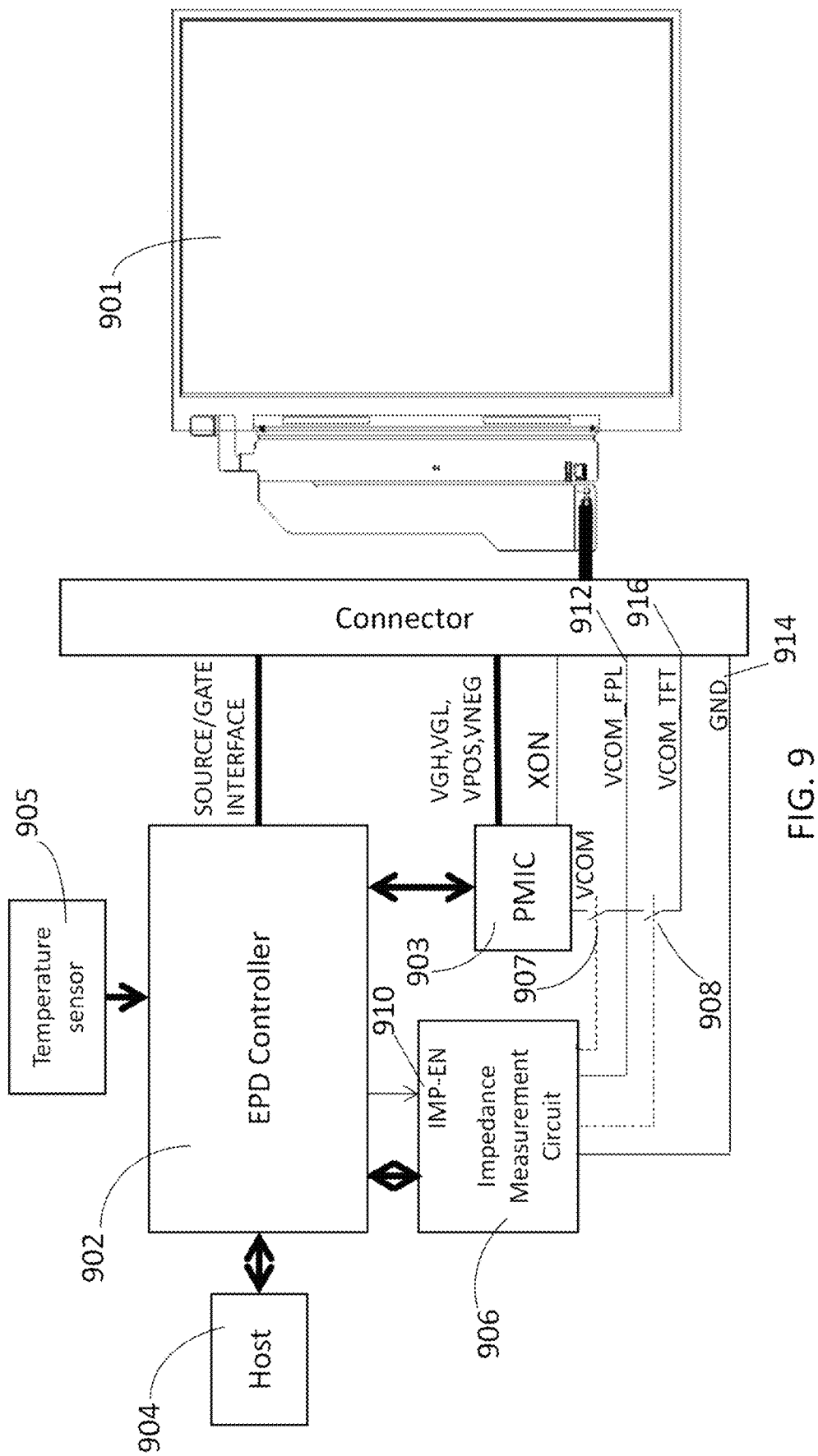
FIG. 9 illustrates a diagram of an embodiment of an electrophoretic display in accordance with the subject matter described herein.

Referring now to FIG. 9, in one embodiment, an impedance measurement may be taken on the entire active matrix display area. In this configuration, the VCOM line of the display, which typically supplies a common bias voltage to the display's front plane or top electrode and the display's transistor array, can be split into two lines. One line is the VCOM_TFT 916, which supplies a bias voltage to the display's transistor network or the active matrix of thin film transistors (TFT), typically by supplying a bias voltage to the terminal of each pixel's storage capacitor opposite the terminal connected to the pixel electrode. The other line is VCOM_FPL 912, which supplies a bias voltage to the display's front plane or top electrode.

As shown in FIG. 9, this setup or configuration may include an active matrix display module 901 which includes a display controller circuit that can be made up of an active matrix display and a source/gate driver, an EPD controller 902, a power management integrated circuit (PMIC) 903 that controls the supply of the high (i.e., VGH) and low (i.e., VGL) gate voltages, the source voltages (VPOS and VNEG), both VCOM voltages, as well as a signal that can turn on all the transistors of the active matrix (e.g., XON signal), a host processing unit 904, a temperature sensor 905, and circuitry 906 for performing the impedance measurements. The circuitry can be configured to be able to perform measurements at a single frequency or to sweep across different frequencies, and one or more switches 907, 908 are included for enabling normal driving when closed and performing impedance measurements when opened.

In some embodiments, to activate the impedance measurements, the gate high voltage or VGH is first set to a voltage between 2 volts to 10 volts. Subsequently, a signal can be sent to turn on all the transistors in the active matrix. This signal can be one known in the art to perform such a task, such as an XON signal. The XON signal may be enabled either from the PMIC 903 or from the GPIO of the EPD controller 902. Subsequently, the impedance measurement circuit 906 may be enabled by setting a signal (e.g., IMP-EN 910) to an appropriate voltage level. Once the impedance measurement circuit 906 is enabled, the switches 907 and 908 may be set to an open state, thereby isolating the VCOM_FPL 912 line to the active matrix module 901. A sinusoidal voltage signal of a given frequency V may be sent to the VCOM_FPL line 912, allowing access to the display's 901 top electrode. The amplitude of this signal may be set to be small (e.g., less than 1 volt) such that it does not excite the nonlinearities of the ink system. Also, because of the signal's small voltage amplitude, the optical effects are minimal and typically not noticeable to a viewer when the impedance measurement is active.

In some embodiments, when the XON signal and the VGH voltage are both on, access to all the pixelated electrodes can be achieved through the ground line GND 914. And the current drawn on the VCOM_FPL line 912 may be measured in the impedance circuit 906. Where the voltage and current may be analyzed and electrical properties such as phase shift may be obtained. In practice, the impedance measurement may be frequency f [Hz] dependent. For example, five to 10 cycles of measurement data may need to be firstly collected before the data can be analyzed. As such, a minimum measurement time of 5/f [s] is needed, which at 1 Hz is at least 5 s, while at 10 Hz it will be only 0.5 s.

Figure 10:
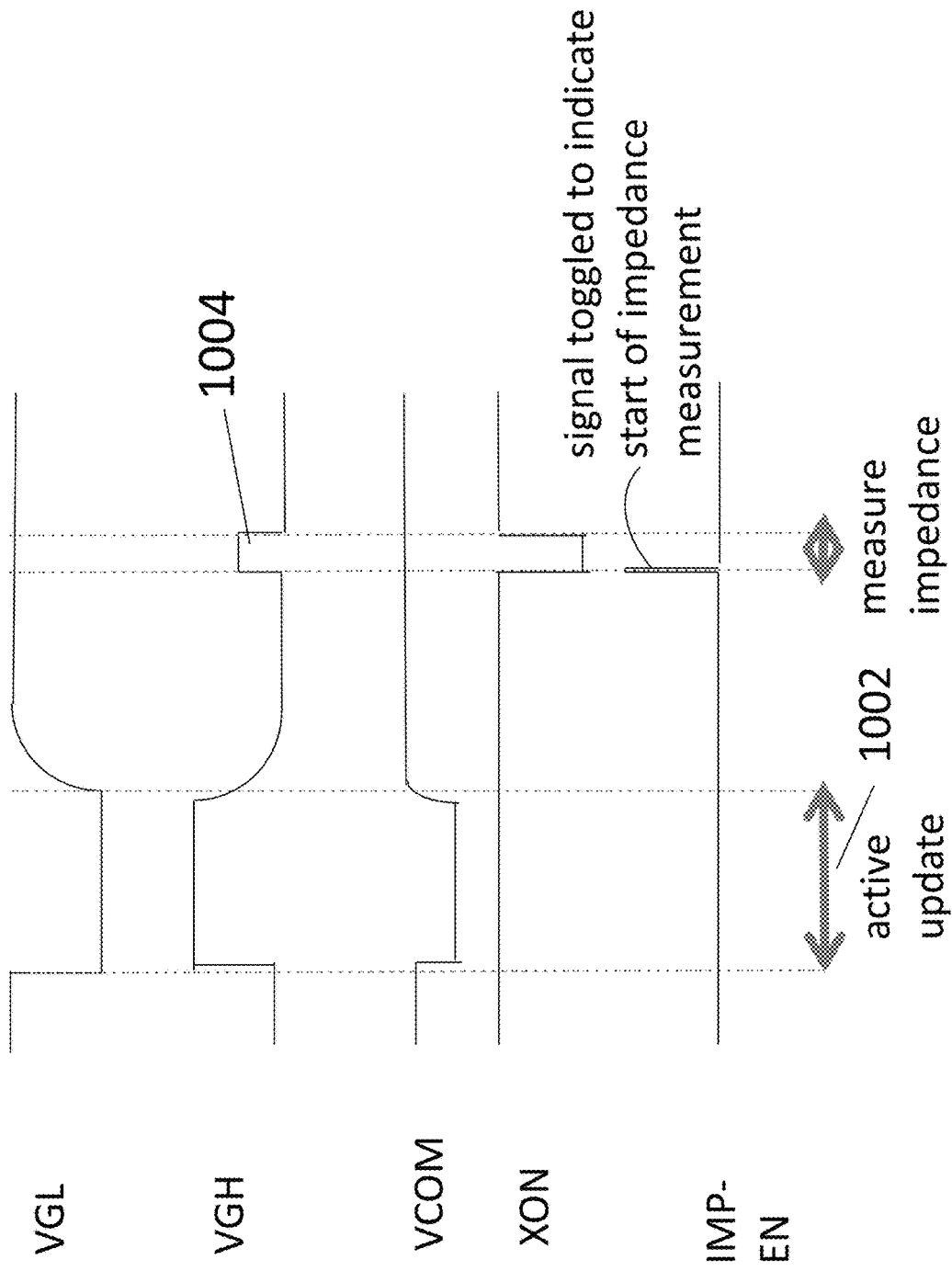
FIG. 10 illustrates an exemplary signal sequence for enabling the impedance measurement as described herein.

Referring now to the signal diagram shown in FIG. 10, after an active update 1002, the IMP-EN switch may be switched on as well as the gate high voltage VGH. And for the duration 1004 where VGH is turned on, the impedance measurements can be taken. It should be appreciated that measurements of impedance using the methods described herein may be taken while the display is idling, in which case a complete frequency scan may be performed.

Figure 11:
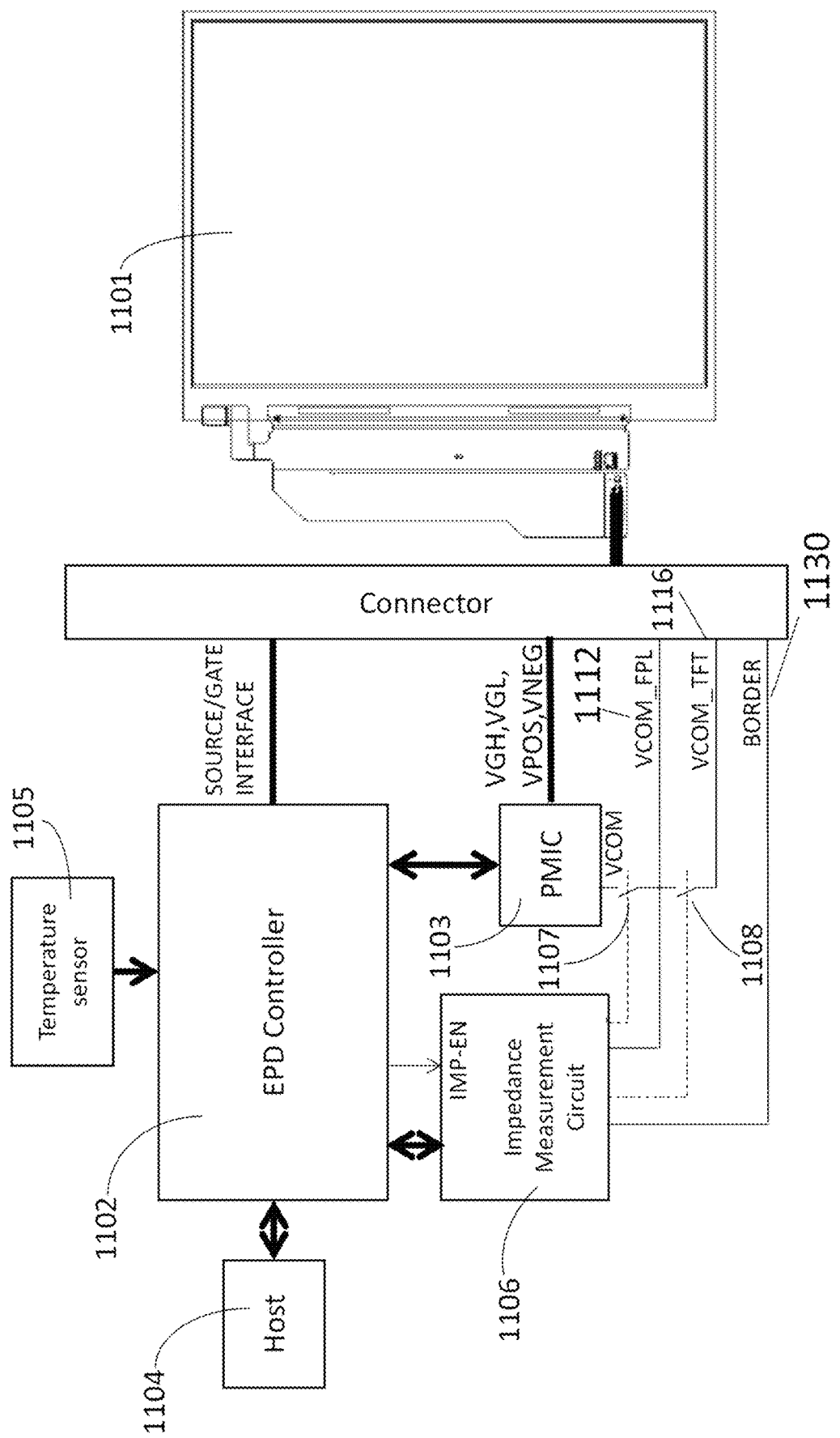
FIG. 11 illustrates a diagram of an embodiment of an electrophoretic display in accordance with the subject matter described herein.

In yet another embodiment, impedance measurements may be obtained from an unused area of the module, for example, in the border area around the outer perimeter of the pixel array. In this case, referring now to FIG. 11, direct access to the bottom electrode of the border area may be achieved through a border electrode line (e.g., BORDER line 1130). In some embodiments, the high gate voltage and the XON signal may not need to be activated and measurements can be taken at any time. As shown in FIG. 11, the XON signal accessibility is no longer needed and the measurements may be done across the BORDER 1130 and the VCOM_FPL 1112 lines.

In another embodiment, a dedicated area may be designed into an active matrix module for the purpose of impedance measurements.

The use of impedance measurements for waveform selection according to the subject matter presented herein instead of using temperature sensor measurements has the advantage of achieving better performance on a display. This is at least partially due to the fact that impedance is a direct measurement of the ink system as opposed to a separate temperature sensor in the device that can only approximate the temperature in which the ink system is experiencing. The impedance measurements can be used to quantify the aging of the display module. This information may be used to assist the selection of appropriate waveform to load to compensate for the aging of the module. With a database of waveforms tied to different impedance data, it is possible for a given time and module, to select the best waveform that can match the closest to the device-level impedance information.

It will be apparent to those skilled in the art that numerous changes and modifications can be made to the specific embodiments of the invention described above without departing from the scope of the invention. Accordingly, the whole of the foregoing description is to be interpreted in an illustrative and not in a limitative sense.

The invention claimed is:

1. A method for driving an electro-optic display comprising a layer of electro-optic material disposed between a common electrode and a backplane, the backplane including an array of pixel electrodes, wherein each pixel electrode is coupled to a pixel transistor, wherein a display controller circuit applies waveforms to the array of pixel electrodes by applying one or more time-dependent voltages between the common electrode and the array of pixel electrodes via the pixel transistors, the method for driving comprising:

applying first measurement waveforms comprising one or more frames to a first portion of pixel electrodes of the array of pixel electrodes, wherein during each frame of the first measurement waveforms the same time-dependent voltages are applied to each pixel electrode of the first portion of pixel electrodes;

measuring a first current flowing through a current measurement circuit coupled between the common electrode and an output of the display controller circuit that applies time-dependent voltages to the common electrode;

determining a first impedance of the electro-optic material in proximity to the first portion of pixel electrodes based on the first current flowing through the current measurement circuit and the time-dependent voltages applied to each pixel electrode of the first portion of pixel electrodes during the first measurement waveforms;

selecting first driving waveforms to apply to each pixel electrode of the first portion of pixel electrodes based on the first impedance of the electro-optic material in proximity to the first portion of pixel electrodes; and applying the first driving waveforms to the first portion of pixel electrodes, wherein the first driving waveforms comprise time-dependent voltages sufficient to change an optical state of the electro-optic display in proximity to the first portion of pixel electrodes.

2. The method of claim 1 wherein the current measurement circuit comprises a resistive element and a differential voltage amplifier, wherein a first input of the differential voltage amplifier is connected to a first terminal of the resistive element, and a second input of the differential voltage amplifier is connected to a second terminal of the resistive element.

3. The method of claim 1 wherein the time-dependent voltages applied to each pixel electrode of the first portion of pixel electrodes comprise a uniform voltage pulse.

4. The method of claim 1 wherein the time-dependent voltages applied to each pixel electrode of the first portion of pixel electrodes comprise a first voltage pulse having a first polarity, and a second voltage pulse having a second polarity opposite of the first polarity.

5. The method of claim 1 wherein the first portion of pixel electrodes comprises all of the pixel electrodes of the array of pixel electrodes.

6. The method of claim 1 wherein the first portion of pixel electrodes comprises pixel electrodes located in proximity to an outer perimeter of the array of pixel electrodes.

7. The method of claim 1 further comprising applying second measurement waveforms comprising one or more frames to a second portion of pixel electrodes of the array of pixel electrodes, wherein during each frame of the second measurement waveforms the same time-dependent voltages are applied to each pixel electrode of the second portion of pixel electrodes;

measuring a second current flowing through the current measurement circuit;

determining a second impedance of the electro-optic material in proximity to the second portion of pixel electrodes based on the second current flowing through the current measurement circuit and the time-dependent voltages applied to each pixel electrode of the first portion of pixel electrodes during the second measurement waveforms;

selecting second driving waveforms to apply to each pixel electrode of the second portion of pixel electrodes based on the second impedance of the electro-optic material in proximity to the second portion of pixel electrodes; and applying the second driving waveforms to the second portion of pixel electrodes, wherein the second driving waveforms comprise time-dependent voltages sufficient to change the optical state of the electro-optic display in proximity to the second portion of pixel electrodes.

8. The method of claim 7 wherein the first portion of pixel electrodes comprises pixel electrodes from a first region of the array of pixel electrodes, and the second portion of pixel electrodes comprises pixel electrodes from a second region of the array of pixel electrodes, and wherein the first and second regions of pixel electrodes do not overlap.

9. The method of claim 7 further comprising applying zero volt waveforms to the second portion of pixel electrodes while applying first measurement waveforms to the first portion of pixel electrodes; and applying zero volt waveforms to the first portion of pixel electrodes while applying second measurement waveforms to the second portion of pixel electrodes.

10. A method for driving an electro-optic display comprising a layer of electro-optic material disposed between a common electrode and a backplane, the backplane including an array of pixel electrodes, wherein each pixel electrode is coupled to a pixel transistor, wherein a display controller circuit applies waveforms to the array of pixel electrodes by applying one or more time-dependent voltages between the common electrode and the array of pixel electrodes via the pixel transistors, the method for driving comprising:

concurrently activating pixel transistors associated with a first portion of pixel electrodes of the array of pixel electrodes;

applying a first voltage to the first portion of pixel electrodes;

injecting measurement waveforms from a signal generation circuit through a current measurement circuit coupled between the signal generation circuit and the common electrode;

measuring a first current flowing through the current measurement circuit based on the measurement waveforms;

determining a first impedance of the electro-optic material in proximity to the first portion of pixel electrodes based on the first current flowing through the current measurement circuit and the time-dependent voltages applied to each pixel electrode of the first portion of pixel electrodes during the first measurement waveforms;

selecting first driving waveforms to apply to each pixel electrode of the first portion of pixel electrodes based on the first impedance of the electro-optic material in proximity to the first portion of pixel electrodes; and applying the first driving waveforms to the first portion of pixel electrodes, wherein the first driving waveforms comprise time-dependent voltages sufficient to change an optical state of the electro-optic display in proximity to the first portion of pixel electrodes.

11. The method of claim 10 wherein the current measurement circuit comprises a resistive element and a differential voltage amplifier, wherein a first input of the differential voltage amplifier is connected to a first terminal of the resistive element, and a second input of the differential voltage amplifier is connected to a second terminal of the resistive element.

12. The method of claim 10 wherein the measurement waveforms comprise periodic square or sinusoidal voltage waveforms.

13. The method of claim 10 wherein the measurement waveforms comprise voltages having an amplitude insufficient to change an optical state of the electro-optic display.

14. The method of claim 10 wherein the measurement waveforms comprise oscillating voltage waveforms having a plurality of frequencies.

* * * * *